US 9,465,059 B2

(12) United States Patent
Dilly et al.

(10) Patent No.: US 9,465,059 B2
(45) Date of Patent: Oct. 11, 2016

(54) METHOD, SENSOR AND SYSTEM FOR ANALYZING APPLIANCES IN A POWER LINE NETWORK

(71) Applicant: Sony Corporation, Minato-ku (JP)

(72) Inventors: Altfried Dilly, Stuttgart (DE); Ben Eitel, Gaertringen (DE); Thomas Kemp, Esslingen am Neckar (DE); Stefan Uhlich, Renningen (DE)

(73) Assignee: SONY CORPORATION, Tokyo (JP)

( * ) Notice: Subject to any disclaimer, the term of this patent is extended or adjusted under 35 U.S.C. 154(b) by 244 days.

(21) Appl. No.: 14/221,630

(22) Filed: Mar. 21, 2014

(65) Prior Publication Data

US 2014/0292304 A1    Oct. 2, 2014

(30) Foreign Application Priority Data

Mar. 28, 2013    (EP) .................................... 13001649

(51) Int. Cl.
*G01R 21/00* (2006.01)
*H04B 3/54* (2006.01)

(52) U.S. Cl.
CPC ................ *G01R 21/00* (2013.01); *H04B 3/54* (2013.01); *H04B 2203/5445* (2013.01); *H04B 2203/5458* (2013.01)

(58) Field of Classification Search
CPC ... G01R 21/00; G01R 21/133; H02J 13/002; Y02B 90/2615; Y04S 40/121
USPC .......................................... 324/76.11; 702/61
See application file for complete search history.

(56) References Cited

U.S. PATENT DOCUMENTS

| 7,345,860 | B2* | 3/2008 | Wong ................... H02H 1/0015 361/42 |
| 7,551,411 | B2* | 6/2009 | Woods .................. B24B 23/028 318/434 |
| 8,094,034 | B2 | 1/2012 | Patel et al. |
| 8,198,998 | B1* | 6/2012 | Propp ................. H02J 13/0024 340/538 |
| 2009/0072985 | A1 | 3/2009 | Patel et al. |
| 2011/0071694 | A1* | 3/2011 | Mammone ............. G06Q 30/02 700/291 |
| 2011/0196634 | A1* | 8/2011 | Kemp ...................... G01D 4/00 702/65 |

FOREIGN PATENT DOCUMENTS

| EP | 2 348 608 A2 | 7/2011 |
| WO | WO 2011/035301 A2 | 3/2011 |

OTHER PUBLICATIONS

Shwetak N. Patel, et al., "At the Flick of a Switch: Detecting and Classifying Unique Electrical Events on the Residential Power Line", UbiComp 2007, LNCS 4717, 18 pages.

(Continued)

*Primary Examiner* — Jermele M Hollington
*Assistant Examiner* — Robert P Alejnikov, Jr.
(74) *Attorney, Agent, or Firm* — Oblon, McClelland, Maier & Neustadt, L.L.P

(57) ABSTRACT

A method for analyzing appliances in a power line network comprises obtaining an electrical characteristic of the power line network, using a sensor that is connected to the power line network, extracting a line-neglecting feature from the electrical characteristic of the power line network, and detecting an appliance connected to the power line network based on the extracted line-neglecting feature.

30 Claims, 5 Drawing Sheets

(56) References Cited

OTHER PUBLICATIONS

Mahmoud Alahmad, et al., "Non-Intrusive Electrical Load Monitoring and Profiling Methods for Application in Energy Management Systems", 2011 IEEE Long Island Systems, Applications and Technology Conference (LISAT), 7 pages.

The Extended European Search Report issued Aug. 5, 2014, in Application No. / Patent No. 14001118.0-1855.

U.S. Appl. No. 14/178,606, filed Feb. 12, 2014, Dilly, et al.

Office Action issued Jan. 25, 2016 in European Patent Application No. 14 001 118. 0.

* cited by examiner

METHOD, SENSOR AND SYSTEM FOR ANALYZING APPLIANCES IN A POWER LINE NETWORK

FIELD OF THE DISCLOSURE

The present specification relates to a method, a system and a sensor for analyzing appliances in a power line network.

DESCRIPTION OF RELATED ART

In any household, many electrical devices as e.g. a coffee maker, a washing machine, a dish washer and others may be connected to a power line network. Appliance sensing techniques might help to monitor such electrical devices (appliances) and their operation, respectively. This might be advantageous for example if the user of the power consumers does not know which devices are currently connected and consume power. When leaving the house, an inhabitant may want to be sure that he has actually switched off specific electrical devices. Further, in apartments that are occupied by an elder person, a relative may be interested to check whether the inhabitant has actually risen in the morning. In such a case, it may be desirable to remotely supervise whether the inhabitant has used the coffee maker. Furthermore, appliance sensing may be useful in the context of a smart grid and/or demand response schemes.

Generally, appliance sensing refers to identifying appliances connected to a powerline network. According to sensing concepts, appliance sensing may be performed e.g. at the fuse cabinet level (i.e. "smart-meter" level). Alternatively, an appliance sensor may be used, which is plugged into an outlet in the home and then senses the surrounding switched-on or attached appliances.

SUMMARY

It is an object to provide an improved method, sensor and system for analyzing appliances in a power line network.

The above object is achieved by the claimed matter according to the independent claims.

Further details of the disclosure will become apparent from a consideration of the drawings and ensuing description.

BRIEF DESCRIPTION OF THE DRAWINGS

A more complete appreciation of the disclosure and many of the intended effects thereof will be readily obtained as the same becomes better understood by reference to the following detailed description when considered in connection with the accompanying drawings, in which.

DESCRIPTION OF THE EMBODIMENTS

Figure 1:
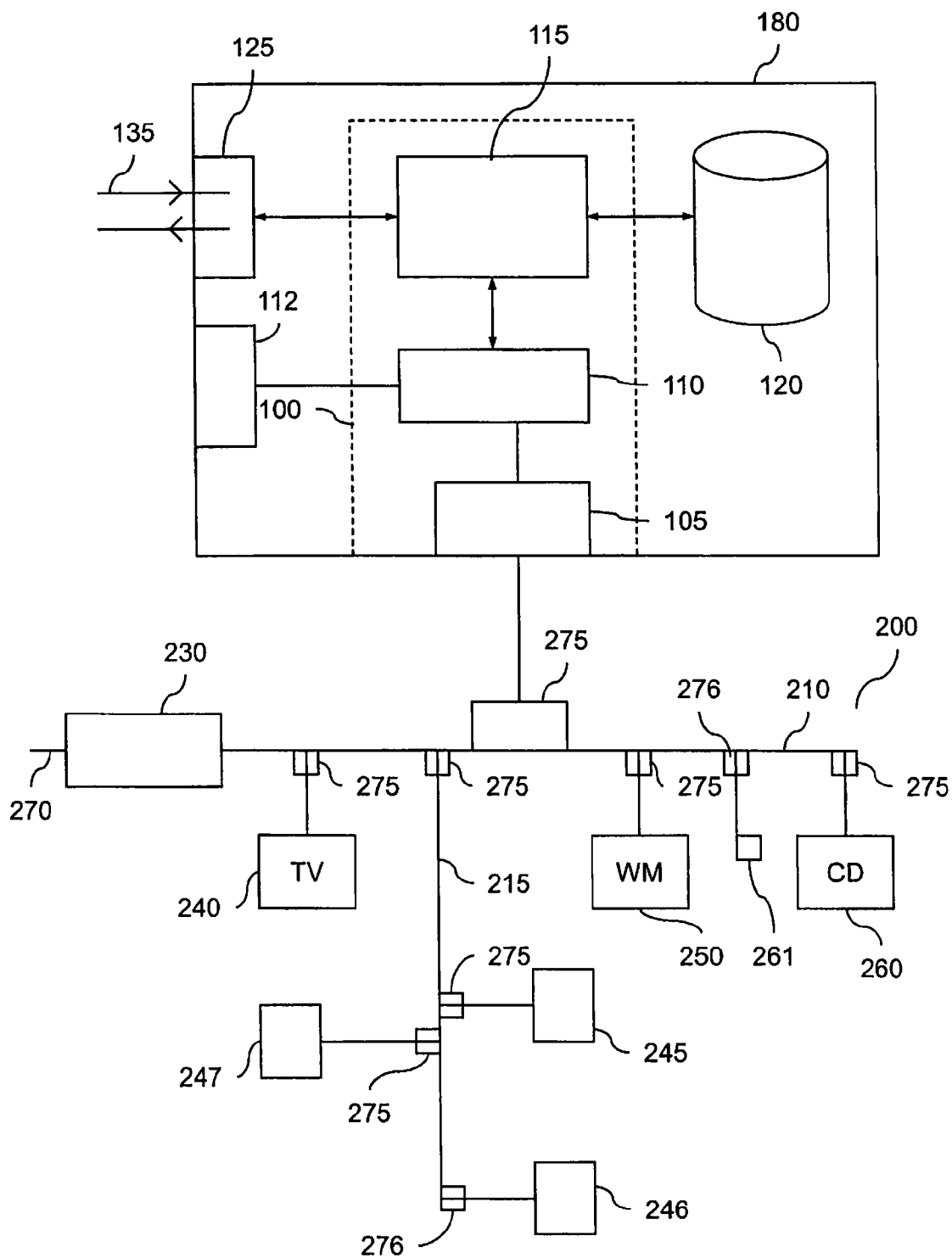
FIG. 1 is a schematic block diagram illustrating an example of a power line network and a system for analyzing a power line network.

The foregoing paragraphs have been provided by way of general introduction, and are not intended to limit the scope of the following claims. The described embodiments, together with further advantages, will be best understood by reference to the following detailed description taken in conjunction with the accompanying drawings. The elements of the drawings are not necessarily to scale relative to each other.

In the drawings, like reference numerals designate identical or corresponding parts throughout the several views.

The description of the embodiments is not limiting. In particular, elements of the embodiments described hereinafter may be combined with elements of different embodiments.

FIG. 1 illustrates an example of a power line network 200 and a system 180 for analyzing appliances in a power line network. The power line network 200 may be any power line network (electricity supply network), in particular a power line network or mains grid that may be present in one or more households, living units, apartments, apartment houses, offices, plants, shops etc.. The power line network 200 may be connected via a power distribution cabinet 230 to a connection line 270 that may connect the power line network 200, for example, to a voltage distribution network or a power plant. According to an embodiment, the power distribution cabinet 230 may be implemented as a fuse cabinet. The power line network 200 may include one or more electric lines or power cables. Depending on national regulations or common practice, each electric line may, for example, include one, two, three or more phase wires of different phase, a neutral wire and a protective earth wire. For example, the power line network 200 may include a main line 210 and several branch lines 215. Connecting cables of electrical devices 240, 250, 261 and 260 may be plugged into wall outlets or sockets 275 to connect the electrical devices with the power line network. Further electrical devices 246 may be connected to the power line system 200 via other connector systems 276. Moreover, the branch line 215 may be connected to the main line 210 via a wall outlet. For example, the branch line 215 may be implemented by a multiple socket-outlet into which the connecting cables of the electrical devices 245 and 247 are plugged.

The term "appliance" as used within the context of the present specification may refer to any electrical device 240 to 260 as illustrated in FIG. 1, for example. Specific examples of the electrical devices might include any possible device such as a light bulb, a refrigerator, a vacuum cleaner, a washing machine, a TV set, a video recorder, a DVD-player, an air conditioner, a CD-player, an internet switch, a set-top box, a battery charging device, a phone, a notebook and others. For example, the electrical devices may comprise stationary electrical devices and mobile (disconnectable) electrical devices. The term "appliance" further may comprise a set of electrical devices that are connected, for example, by means of a branch line 215, to a multiple socket-outlet or an extension lead with a specific outlet 275. The term "appliance" is not restricted to power consuming devices. According to an embodiment, this term may further encompass power generating devices, for example, a solar power plant that may be attached to the roof of a house, a geothermal power plant and others. Furthermore, the term may also encompass electric vehicles connected to the power line network, which consume power during charging, but which may feed power from their batteries to the power line network at other times.

As will be readily appreciated, an appliance is not necessarily static, for example, a vacuum cleaner or other mobile devices such as a notebook or a battery charger may be plugged into different outlets in the flat. Furthermore, appliances may be inactive (i.e. neither consume nor produce power, e.g. because they are switched off) for some periods of time and active for other periods of time. Additionally, appliances may be operated at different operation states. For example, depending on a program currently running and, optionally, a point within the program, the washing machine or the dishwasher may be in a different operation state (such as, for example, drying or tumbling). Further, an appliance such as a washing machine or a dish washer may be operating in an "economy program", e.g. a dedicated power saving mode. Still further, notebooks, TV sets, video recorders, for example, may be in a standby mode, i.e. being inactive but consuming some power. According to a further embodiment, an appliance may be in a power consuming or a power delivering state. For example, as has been mentioned above, an electric vehicle may be charged, thus consuming power, or may feed power from its battery to the power line network, thus delivering power. In the context of the present specification, the term "connected to the power line network" is intended to mean that a line supplying power to a specific appliance such as a connection cable is connected with the power line network. For example, the connection cable of a specific appliance may be plugged into a socket. The specific appliance may be in an arbitrary operation state. For example, the appliance may be switched on or switched off, the appliance may be operated at level 1 or 2, it may be in a standby mode, it may supply power or consume power. The term "active appliance" refers to an appliance connected with the power line network, the appliance consuming or delivering power. For example, the appliance may be connected and switched on.

The shown power line network 200 illustrates a commonly used power line network. As is clearly to be understood, any kind of power line network may be used for the purposes of the present disclosure. In the context of the present disclosure, the term "power line network" refers to an electrical network that may be present in an arbitrary entity such as an apartment, a building, an urban quarter, a town and others and to which one or more arbitrary appliances are connected.

The system 180 for analyzing appliances in the power line network 200 comprises a sensor 100 for analyzing appliances in the power line network. The sensor 100 comprises a connector 105 that is configured to be connected to the power line network 200. For example, the connector 105 may be connected to a socket 275 or outlet of the power line network 200. According to a further embodiment, the connector 105 may be connected to the power line network 200 by an arbitrary connector system, for example, at the power distribution cabinet 230. The sensor further comprises a measurement unit 110 configured to measure an electrical characteristic of the power line network 200. The sensor further includes a processor (or other circuitry) 115 configured to extract one or more line-neglecting feature from the measured electrical characteristic of the power line network and to detect a connected appliance on the basis of the line-neglecting feature. For example, the processor 115 may compare the line-neglecting feature of the electrical characteristic of the power line network 200 with line-neglecting features of several candidate appliances. According to a further embodiment, the processor 115 may compare the line-neglecting feature of the electrical characteristic of the power line network 200 with line-neglecting features of several candidate appliances at different operation states The system shown in FIG. 1 may further comprise a memory 120 for storing electrical characteristics and/or line-neglecting features of a plurality of electrical devices or candidate appliances; for example, there might be stored several sets of electrical characteristics and/or line-neglecting features for an individual appliance, each associated with a different operation state of the appliance. Instead or in addition, the system 180 may comprise a communication unit 125 for transmitting a result of detecting a connected appliance and/or for receiving electrical characteristics and/or line-neglecting features of candidate appliances to be used in detecting the appliances connected to the power line network (as indicated by arrows 135).

The term "line-neglecting feature" as used within the context of the present specification, is intended to mean a feature which is (approximately) independent from the influence of the lines or wires of the powerline network. A line-neglecting feature (approximately) does not depend from (properties of) the line/power line network between an appliance and the point where the appliance's electrical characteristic is measured, such as line length or conductivity. Rather, the line-neglecting feature mainly depends from the electrical characteristic of a specific appliance or of a combination of appliances connected to the power line network. A line-neglecting feature may be only "approximately" line-independent, since there might exist a very small power line network dependency of such a "line-neglecting" feature (e.g. because voltage amplitudes do not add up linearly because of non-linear effects of the power line) that is normally hardly measurable, but theoretically exists under specific assumptions. Thus, this line-dependency of the line-neglecting features can be neglected for appliance and/or operation state recognition. For example, the line-dependency may be approximately up to 5% of the measured electrical characteristic. For example, a line-neglecting feature may be independent of linear effects of the power line network. For example, a line-neglecting feature may be a feature which is line-independent to first-order/line-independent but only to a first-order, or linear approximation. The expression "to first order" refers to a Taylor series expansion of the effect, where the first order term describes the linear part of the effect. According to customary practice, in engineering, only linear effects are accounted for, and the contemplated features are line-independent except for nonlinear effects, they are therefore called herein "line-neglecting" features. Generally, a line-neglecting feature can be measured/detected independently or largely independently from the appliance's location in the (residential) power line network in relation to the location where measurements for obtaining the electrical characteristic are taken. This is due to the fact that the line-neglecting feature is not or nearly not changed or influenced by properties of the line, such as length and conductivity.

The term "feature" as used in the present context refers to a property such as a step, a peak or a distance between steps, peaks or a step and a peak that may be extracted from the electrical characteristic. It preferably relates to a prominent or distinctive part of the electrical characteristic. Specific examples of such a feature will be given below in more detail.

The measurement unit 110 is configured to measure an electrical characteristic of the power line network 200 via the connector 105. Generally, measurements of an electrical characteristic of the power line network are performed via the connector 105 that may be connected with the power line network 200 in the manner explained above. The electrical characteristic of the power line network may in one embodiment correspond to the measurement(s) (result of the measurement(s)), or it may be derived from the measurement e.g. by processing the measurement(s) or by calculation. For example, the electrical characteristic may be obtained by measuring or deriving one or more of the current, the voltage, the complex-valued impedance, the S-parameter or the complex-valued admittance of the power line network. As an alternative, any of the real part and the imaginary part of any of these measurement values may be used. Measurements may be taken at one or more measurement points, e.g. by the measurement unit 110 and/or additional measurement units not shown in FIG. 2, e.g. over a line cycle or at one or more specific points in time.

For example, the measurement unit 110 may inject a test signal, for example $U_r(f,\tau)$ and/or $I_r(f,\tau)$ at one or more fixed carrier frequencies f, wherein $\tau$ denotes a line cycle position, $\tau$ lying in the time interval from 0 to $2\pi/\omega_{PL}$, wherein $\omega_{PL}$ may be 50 or 60 Hz in commonly used power line networks, for example. Then, the measurement unit 110 may measure the voltage $U_o(f,\tau)$ and/or current $I_0(f,\tau)$ via the connector 105, which may include reflections of the test signal. From the measurement, the electrical characteristic may be obtained. By way of example, the electrical characteristic may be derived based on the knowledge about the injected test signal. For example, the electrical characteristic of the power line network may be determined by determining a complex-valued admittance which is defined by $Y(f,\tau)=I_0(f,\tau)/U_o(f,\tau)$. The measurement unit 110 may be capable of generating the test signal in a certain frequency range. By way of example, the frequency range may be from about 50 kHz to about more than 225 kHz and even more. Further, the measurement unit 110 may be configured to appropriately sense and measure the voltage $U_0(f,\tau)$ and/or the current $I_o(f,\tau)$ in this frequency range. Specific configurations of the measurement unit are generally known and may be implemented by a device or circuitry for measuring a complex-valued admittance via the connector 105.

The processor 115 may be implemented by any kind of processing device, comprising, for example, a CPU ("central processing unit"). Contrary to the configuration shown in FIGS. 1 and 2, the processor may not be housed by the same housing as the further components of the sensor. For example, the measurement unit 110 may be plugged to the socket 275 or the power line network 200 via the connector, and the measurement values, for example, $U_0(f,\tau)$ and $I_o(f,\tau)$, may be transmitted to the processor that may be a component of a commonly employed computer. Still further, the processor may be disposed at a place remote from the power line network. According to this embodiment, the measurement values, for example, $U_0(f,\tau)$ and $I_o(f,\tau)$, are transmitted by any kind of line connection or wireless connection to a computer located at any place in the world.

The processor 115 is configured to extract a line-neglecting feature from the measured electrical characteristic of the power line network. Further, the processor is configured to detect a connected appliance based on the line-neglecting feature. According to an embodiment, line-neglecting features of a plurality of candidate appliances may be stored in the memory device 120 that forms part of the system 180. For example, these line-neglecting features may have been extracted from the electrical characteristic of the appliances. According to a further embodiment, the memory device 120 may be separate from the system 180 and e.g. be constituted by a remote server. The memory device 120 may also comprise a disk drive into which a storage medium such as a CD (compact disk), DVD (digital versatile disk) or flash memory may be inserted, or an interface to a storage device such as a USB (universal serial bus) interface.

Figure 3:
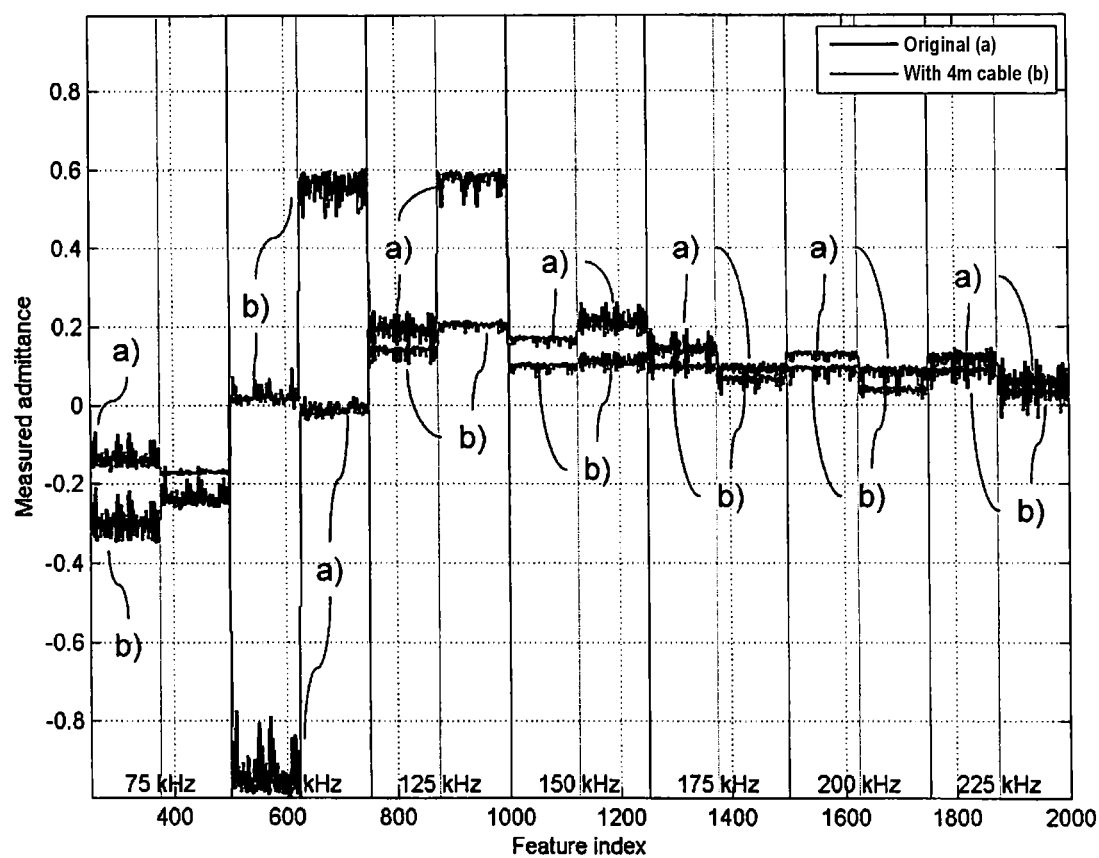
FIG. 3 shows an example of an electrical characteristic of a TV set that is taken under different conditions.

An example of the specific operability of the processor 115 in order to determine a line-neglecting feature will be explained below with reference to FIGS. 3 and 4. The processor 115 may be further connected with a communication unit 125 that is capable of communicating with the exterior world, e.g. with a user, a remote memory device 120, with one or more service providers etc. For example, the communication unit 125 may provide a modem connection to the internet or intranet by wireless or cable connections. The communication unit 125 may be a commonly used router that is connected to the sensor 100. The communication unit 125 may communicate with the exterior by means of known communication methods, comprising any kind of wireless or wireline connection. Examples of the wireless or wireline connection include a modem connection, a local-area network ("LAN") connection including the Ethernet, or a broadband wide-area ("WAN") connection such as a digital subscriber line ("DSL"), cable high-speed internet connection, dial-up connection, fiber optic connection, power line carrier connection and others.

According to an embodiment, the processor 115 is configured to detect an appliance connected with the power line network. In the context of the present disclosure, the term "detect an appliance" is intended to mean that the processor finds out whether any appliance is connected or not without necessarily finding out which appliance is connected or not. According to a further embodiment, the processor 115 is configured to identify an appliance connected with the power line network. In the context of the present disclosure, the term "identify an appliance" is intended to mean that the processor finds out which appliance is connected. For example, the processor 115 may find out that a specific appliance such as the vacuum cleaner is connected with the power line network. According to an embodiment, the processor 115 may be configured to detect or identify active appliances only, e.g. appliances that are switched on or consume or deliver power. According to another embodiment, the processor 115 may identify an operation state of a specific appliance. For example, the processor 115 may find out that the TV set is in a standby mode and that the washing machine is tumbling. For example, the detection result may be provided to a user in the form of a list, e.g. on a display, including the names of the appliances as well as their operation states. According to a further example, the detection result may be provided to the user in the form of an interactive list including an option for responding, such as "disconnect the electric iron", in case the processor detects that the electric iron is connected and switched on. For example, such a command may be transferred to the iron via the power line by means of power line communication (PLC), wireless or wireline communication. According to still a further example, the information may be presented to a user in a system, in which the user may activate a further appliance, for example, the washing machine, if it is determined that the solar power plant attached to the roof delivers power. Alternatively, the detection result may be stored in a (remote) database or may be provided to an external service provider, e.g. to be used in a demand response scheme.

Figure 2:
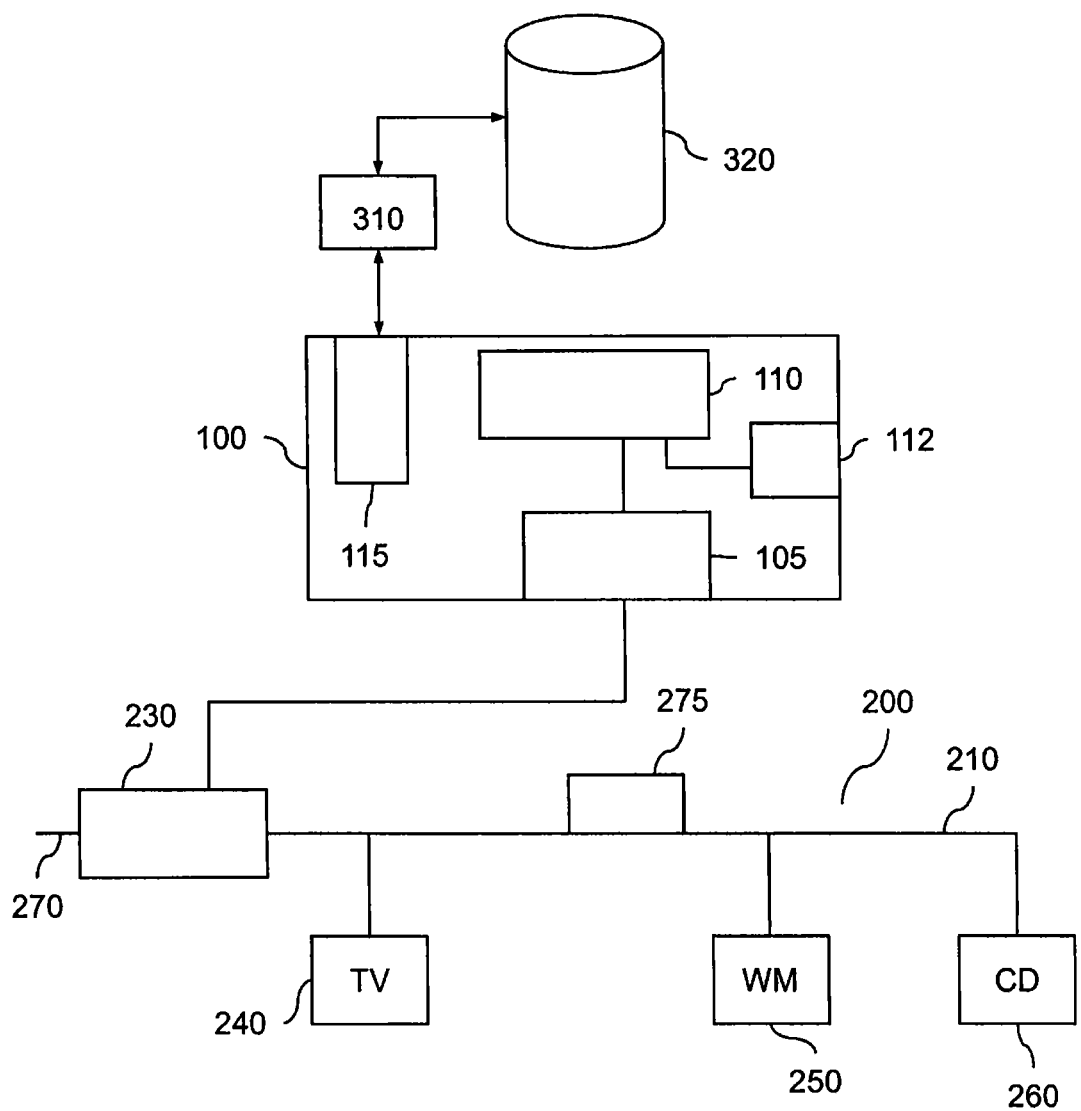
FIG. 2 illustrates a further example of a power line network including a sensor according to an embodiment.

FIG. 2 illustrates a configuration including a power line network 200 which may be similar to the power line network 200 illustrated in FIG. 1. According to the configuration of FIG. 2 the sensor 100 is implemented as a separate device. For example, the sensor 100 may be connected via an external communication unit 310 to an external database 320. The communication unit 310 may provide, for example, a connection to the internet in a similar manner as has been described above for the communication unit 125. The sensor 100 comprises a connector 105 that is, by way of example, connected to the power line network 200 at the power distribution cabinet 230. The sensor 100 further comprises a measurement unit 110 and a processor 115. The components of the sensor may operate in a similar manner as the components of the sensor 100 illustrated as a part of the system of FIG. 1. The sensor 100 may further comprise an appliance connector 112 for directly connecting to a specific appliance. When the specific appliance is connected to the appliance connector 112, the measurement unit 110 may perform measurements as explained above. The appliance connector 112 may further deliver power to the specific appliance. For example, the measurement unit 110 is configured to measure an electrical characteristic of the appliance. Since the appliance is directly connected to the appliance connector 112, the electrical characteristic of the appliance alone, i.e. without influences of the power line network, is measured. Further, the processor 115 may be configured to extract a line-neglecting feature from the measured electrical characteristic of the appliance. According to an embodiment, the appliance connector 112 may be implemented by a socket.

In a similar manner as has been described above, components of the sensor may be disposed at different locations. For example, the processor 115 may be disposed at a location different from the power line network.

According to an embodiment, the system 180 or the sensor 100 may be implemented in, for example, a DSL router or a modem, for example, a power line communication modem. The router or the modem on one side provides the communication interface to the internet or generally to a communication network via any kind of wireless or wireline connection. As a further functionality, the sensor 100 or the system 180 may be included into the DSL router or the modem, in order to analyze the power line network 220.

The term "line-neglecting feature" will be explained in the following. FIG. 3 shows examples of a measured admittance for a TV set which in case a) is attached directly to the power line. According to curve b), there is 4 m extension cable disposed between the TV set and the power line. The measurement has been made for seven different carriers, i.e. at 75 kHz, 100 kHz up to 225 kHz. The right-hand portion of each measurement for a specific carrier frequency shows the imaginary part of the admittance in dependence from τ, whereas the left-hand portion shows the real part of the admittance in dependence from τ. As becomes apparent, the admittance largely varies in dependence on whether the extension cable is present or not.

It is therefore proposed herein to take the effects of a power line network into account when detecting appliances connected to the power line network by using one or more line-neglecting features.

As has been discussed above, the processor 115 is configured to extract a line-neglecting feature from the electrical characteristic of the power line network. The line-neglecting feature(s) can be extracted from an electrical characteristic such as the admittance illustrated in FIG. 3.

Figure 4:
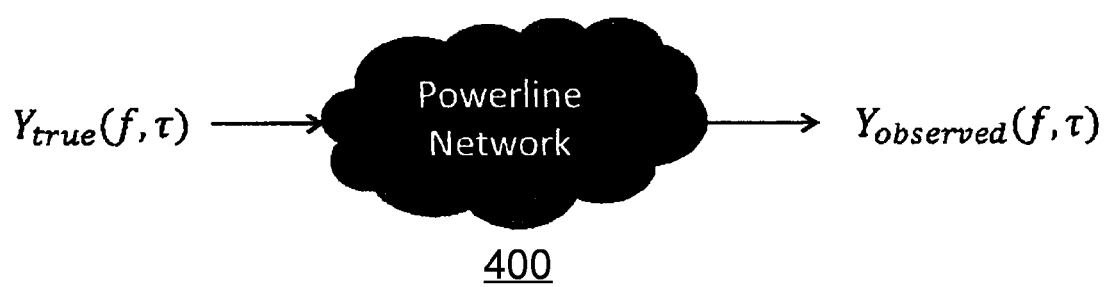
FIG. 4 shows a schematic diagram helpful for further understanding the principles underlying the present disclosure.

FIG. 4 illustrates an approach that is used to derive line-neglecting features.

Basically, the power line network is considered here as a black box 400 which maps the true appliance characteristics to observed ones. For assessing the true appliance characteristic, the fact can be exploited that the mapping should be continuous and therefore a change of $Y_{true}(f,\tau)$ in f or τ will result in a change of $Y_{observed}(f,\tau)$. Generally speaking, extracting the line-neglecting feature and detecting a connected appliance may comprise comparing one or more line-neglecting features representing the electrical characteristic of the appliance and one or more line-neglecting features representing the measured electrical characteristic of the power line network. In accordance with this approach, the following methods may be used in order to extract a line-neglecting feature from an electrical characteristic (e.g. the electrical characteristic of the power line network obtained as described above).

a) A peak or a step of the electrical characteristic, for example, $Y_{true}(f,\tau)$ over the line cycle position, i.e. over τ, will remain a peak or step in $Y_{observed}(f,\tau)$ ("peak/step preservation"). Only its short time scale shape (e.g. step response) might change due to a state change of other electrical devices or appliances connected to the power line network. Accordingly, a line-neglecting feature can be extracted by counting peaks and/or steps of the observed admittance. The specific pattern of peaks and steps may be recognized from the electrical characteristic of candidate characteristics, that are, for example, stored in a memory.

b) According to a further approach, the relative delay $\Delta\tau=\tau_2-\tau_1$ between two peaks or steps of the electrical characteristic, for example, the admittance $Y(f,\tau)$ over the line cycle may be determined. The relative delay of the true electrical characteristic, for example, the admittance $Y_{true}(f,\tau)$, of a certain appliance is equal to the relative delay Δτ of the measured electrical characteristic, for example, the admittance $Y_{observed}(f,\tau)$. This feature is called herein the "relative switching time instances". Accordingly, a line-neglecting feature may be extracted by determining a distance between any two peaks/steps in the electrical characteristic, for example the admittance, of a candidate appliance shown e.g. in FIG. 3 in a specific operation state or of a power line network. For determining whether the electrical appliance is in the specific operation state, for example, peaks/steps having this relative delay may be searched for in the measured electrical characteristic of the power line network in order to find a coincidence.

c) Taking the 50 or 60 Hz line cycle as a time reference, the absolute time position τ of peak/step of the admittance $Y_{true}(f,\tau)$ over the line cycle can be assumed to be the same in $Y_{observed}(f,\tau)$. In other words, in the graphs shown in FIG. 3, the time positions of the peaks should be approximately independent from the power line network. This is due to the relative large frequency jitter of the 50/60 Hz line cycle compared to the short transmission delays over the transmission line (approximately 3.2 μs over a cable length of 1000 m). This feature is called herein the "absolute switching time instances". Accordingly, the measured time positions of the peaks in a line cycle may be determined in order to extract the line-neglecting feature. Further, e.g. by comparing the measured time positions with the absolute switching time instances of a characteristic of a candidate appliance, it can be determined whether the candidate appliance is connected or not.

According to an example, after the line-neglecting features have been extracted from the electrical characteristic of the power line network, a combination of one or more connected appliances and, optionally, their operation states may be identified. For example, disaggregation algorithms may be used to identify the combination of the connected appliances or the combination of the connected appliances in their specific operation states. Identifying the connected appliances and, optionally, their operation states may be accomplished using any of the above-described methods and any combination thereof. According to an illustrative example, a disaggregation algorithm may comprise identifying an appliance based on the line-neglecting feature and removing the line-neglecting feature associated with the identified appliance from the electrical characteristic.

According to an embodiment, the method may be unable to identify all appliances connected. To be more specific, even after performing a disaggregation algorithm using all candidate appliances and their operation states, a residue of the electrical characteristic may remain. This may e.g. happen when an appliance is connected to the power line network, but if that appliance (or the corresponding electrical candidate characteristic, respectively) is missing in the database/memory/website etc. with the candidate appliances. According to an embodiment, the method may be implemented in a manner that a disaggregation is performed so as to yield in a minimum residue. According to a further embodiment, the sensor or system may output as a result "unidentified appliance connected with the power line network".

The line-neglecting features are in one embodiment determined for a plurality of different frequencies, for example, by injecting several test signals, each having a different frequency, at different timings according to the above methods a) to c).

According to a further embodiment, a multi-tone signal, for example, one signal comprising several fixed frequency signals may be injected at one timing. For example, the several fixed frequency signals may be selected so as to avoid or minimize interferences from one another. According to an example, such a multi-tone signal may be an OFDM signal. Nevertheless, as will be appreciated by the person skilled in the art, any other signal comprising several fixed frequency signals, in which interferences from one another are avoided or minimized can be employed.

Embodiments of the disclosure may extract one of those line-neglecting features from the electrical characteristic of the power line network for detecting appliances in a power line network. Different embodiments may use two or all of the line-neglecting features described above. The more line-neglecting features are used, the more reliably the system/sensor will be able to detect and identify the appliances connected to the power line network.

According to the methods explained above, one or more electrical device/appliance and, optionally, its operation state, is identified based on one or more of line-neglecting features of the electrical characteristic of the power line network and a plurality of candidate characteristics or their corresponding line-neglecting features. In particular, it may be determined by the processor 115 which combination of one or more appliances connected to the power line network might explain or best explain the one or more line-neglecting features observed in the electrical characteristic of the power line network.

For obtaining the candidate characteristic, the sensor 100 or system 180 may perform or instruct measurements of an electrical characteristic, for example, the complex-valued admittance, in order to obtain the characteristics of the devices that are usually present in the power line network, and extract the line-neglecting features in the manner as explained above, e.g. by applying any of methods a) to c). This may be done during a training phase, during which only one appliance should be active at a time (at least within the same premises), in order to avoid that other appliances falsify the results. Alternatively, this may be accomplished by connecting a candidate appliance directly to the sensor in the manner as described with reference to FIG. 2 or FIG. 5 below. During this training phase, the appliance may be analyzed in its different operation states so as to obtain the electrical characteristic and/or line-neglecting features for the appliance in dependence from the operation states. According to an embodiment, during such a training phase, a user may provide some input, e.g. via a user interface, to label the appliance currently under investigation, for example, "light bulb in the attic", "tumbling program of the washing machine" or "coffeemaker".

According to an embodiment, the line-neglecting features that are associated with different appliances can be combined so as to find (e.g. a maximum number of) matches with the line-neglecting features of the electrical characteristic of the power line network. For example, the switching time instances may be extracted from the measured admittance and the smallest combination of appliances that can "explain" the measured feature points can be searched for, e.g. by means of disaggregation. This problem is a form of the "set covering problem", where it is intended to find a minimum number of sets whose joint elements are a super set of the target set. A. Caprara, P. Toth, and M. Fischetti, "Algorithms for the Set Covering Problem", Annals of Operations Research, 89, 353-371, 2000 describes further details of algorithms that solve the Set Covering Problem.

Figure 5:
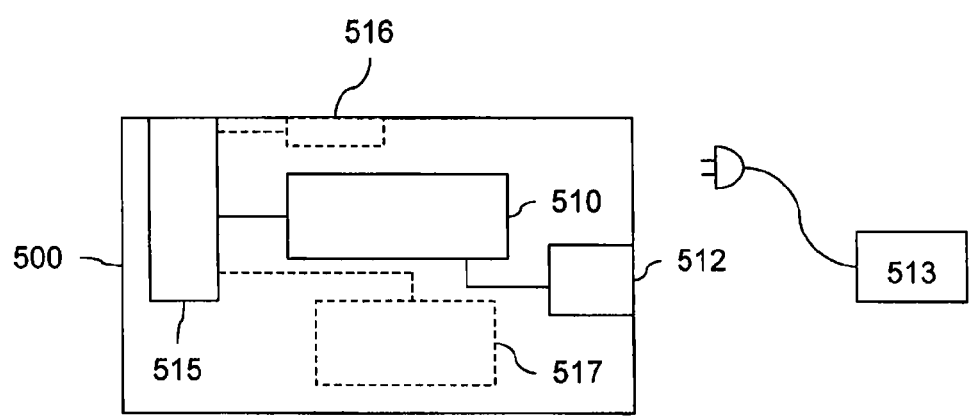
FIG. 5 shows a device for analyzing an appliance.

According to a further embodiment, a device 500 for analyzing an appliance may be used for determining line-neglecting features of an appliance. FIG. 5 illustrates an example of a device 500 for analyzing an appliance. The device 500 comprises an appliance connector 512 configured to be connected to the appliance 513, and a measurement unit 510 configured to measure an electrical characteristic of the appliance 513 via the appliance connector 512. The device 500 further comprises a processor or other circuitry 515 configured to extract a line-neglecting feature from the measured electrical characteristic of the appliance 513. The appliance connector 512 may be a socket which may also supply voltage to the appliance 513. The further components may be similar to the components illustrated in FIGS. 1 and 2, respectively. The device 500 may further comprise an interface 516 to transmit the line-neglecting feature to an external device such as, for example, an external database or a sensor or a system for detecting an appliance in a power line network as has been described above. Further, the device 500 may comprise a memory 517 for storing the line-neglecting features and/or the electrical characteristics of analyzed appliances. According to an embodiment, the memory 517 stores at least the electrical characteristics or line-neglecting features of a certain set of appliances. For example, such a certain set may comprise all appliances which exist in a specific household, as well as their different operation states. According to a further embodiment, the memory 517 may store the electrical characteristics of appliances which are available to be connected to the power line network to be analysed by the sensor or system, respectively.

According to a further implementation of the above method, line-neglecting features such as the counted number of steps or peaks explained under a), the relative delays explained under b) and/or the switching time instances explained under c) may be extracted after determining the electrical characteristic, for example, the admittance of the appliance. Then, any of the line-neglecting features may be stored in a database. For example, these line-neglecting features may be stored in the memory 120 of the system or a remote database 320 as is, for example, shown in FIG. 2. According to this implementation, a reduced number of measurement values is stored and evaluated. As a consequence, the evaluation may be performed at a higher speed and using less storage capacity.

According to an embodiment, the memory 120 or the database 320 may be preloaded with the characteristics or line-neglecting features of commonly used electrical devices that may be connected to the power line network such as, for example, TV sets, Blu-ray players and others. In particular, the memory 120 or the database 320 may be preloaded with the characteristics or line-neglecting features of electrical devices that are actually used in the household, for example, the TV model that is used in the household, in dependence from operation states in which they may be operated (e.g. with different electrical characteristics for the different operation states of the different appliances). For example, characteristics to be preloaded to the memory 120 can be downloaded from internet pages or servers of e.g. device manufacturers which may offer the characteristics or even the line-neglecting features of the different devices they produce. According to an embodiment, the line-neglecting features may be extracted by the device 500, the sensor 100 or system 180, respectively, either during an extraction phase, within which one or more line-neglecting features for a plurality of appliances (e.g. every appliance connected to or likely to be connected to the power line network or appliances indicated by a user by manual input) are stored in a local memory 120 or database 320 or memory 517, or in real-time during an analysis of the power line network for the currently connected or active appliances. Thereby, the step of connecting new devices to the power line network may be further simplified; for example, a training phase as described above may not be necessary, or only in reduced form e.g. to collect data about only some of the appliances existent in a household or, in the form of the above-mentioned extraction phase, to derive the line-neglecting features from known characteristics.

According to an embodiment, only the line-neglecting features of the appliances are stored and used during processing. In this case, due to a reduced amount of data in comparison with the electrical characteristic, computing time and storage might be saved. According to a further embodiment, the memory 120 or database 320 that stores at least the electrical characteristics or line-neglecting features of a certain set of appliances may be implemented as a separate device. For example, the memory 120 or database 320 may be implemented as a memory medium such as a memory stick or memory card storing the electrical characteristics or line-neglecting features of devices such as a washing machine, dish washer, vacuum cleaner and others of a specific brand or which are actually present in a household.

In this context, it might be advantageous if appliances produce unusual or unique electrical characteristics/line-neglecting features, because it might accelerate the above-described processes. To achieve this, for example, the device manufacturers might adapt the devices such that they have a unusual or unique electrical characteristic or unique line-neglecting features. For example, device manufacturers may adapt the devices so as to make the devices produce a certain sequence of switching times and peaks etc. According to a further embodiment, device manufacturers may adapt the devices so that they identify the manufacturer, e.g. all devices of a specific brand to have a recurring part. According to a further embodiment, the devices may be made so that they have an electrical characteristic or a line-neglecting feature that uniquely identifies the device. Thereby, it is possible to introduce a unique signature. Due to the introduction of a unique signature, the devices may be faster identified and at a higher reliability.

Figure 6:
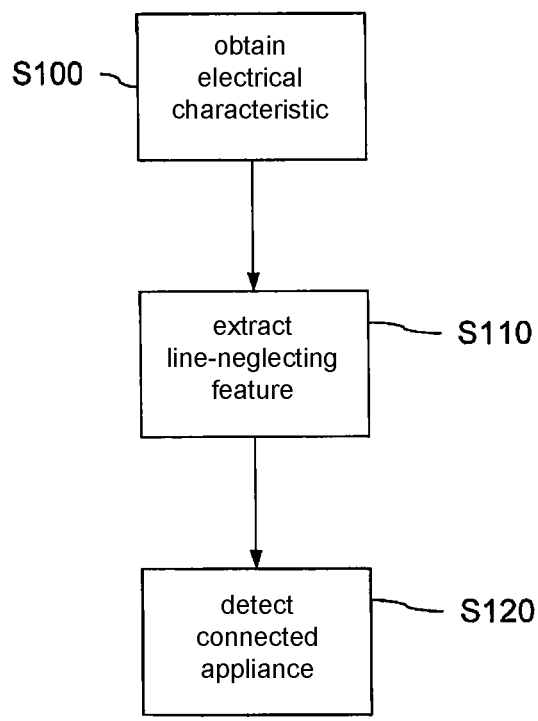
FIG. 6 is a simplified flowchart illustrating a method according to an embodiment.

FIG. 6 shows components of the method for detecting an appliance in a power line network. The method comprises obtaining an electrical characteristic of the power line network (S100) using a sensor that is connected to the power line network, extracting a line-neglecting feature from the electrical characteristic of the power line network (S110) and detecting a connected appliance based on the extracted line-neglecting feature (S120).

According to an embodiment, obtaining the electrical characteristic of the power line network may comprise causing the sensor to inject a test signal, e.g. $U_t(f, t)$ or $I_t(f, t)$ at a fixed frequency f, and to measure at least one of the group consisting of the voltage $U_o(f, t)$ and $I_o(f, t)$. For example, a plurality of test signals, each having a different fixed frequency, may be caused to be injected at different timings. The electrical characteristic and the line-neglecting feature may be as defined above.

For example, such a process may be implemented by a commonly used computer or computer system. Such a computer may, for example, obtain the electrical characteristic from a measurement unit 110 as explained above with reference to FIGS. 1 and 2. The computer may instruct the measurement unit 110 to perform the measurement of the electrical characteristics. The computer may be disposed at a location that is different from the location of the measurement unit 110. According to a further embodiment, the above method may be implemented by a sensor 100 or a system 180 as has been explained above with reference to FIGS. 1 and 2.

According to an embodiment, a computer program may include computer-program instructions which cause a computer or a data processing apparatus to perform the above method. According to a further embodiment, a non-transitory computer-readable medium may include the computer program. Examples of the non-transitory computer-readable medium comprise commonly employed storage media such as CD, DVD or flash memory, for example.

Figure 7:
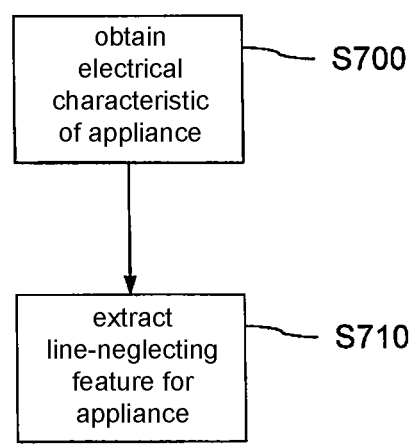
FIG. 7 is a simplified flowchart illustrating a method according to a further embodiment.

FIG. 7 shows components of a method for analyzing an appliance according to an embodiment. The method comprises obtaining (S700) an electrical characteristic of the appliance, e.g. using a sensor that is connected to the appliance, and extracting (S710) a line-neglecting feature from the electrical characteristic of the appliance. The single components of this method may be implemented in the manner described above. For example, this method may be performed in a training phase before putting the sensor or the system for detecting an appliance in a network into operation.

As has been explained in the above, the method and the sensor are configured to cope with the transmission line effect for appliance sensing. Due to the use of line-neglecting features, the analysis of the power line network may be made less dependent from the specific network topology. As a result, the analysis is more reliable. This may be useful in cases in which devices are plugged into different outlets or may be plugged by means of an extension cable.

The present technology is also in the following structures and methods:

(1) A method for analyzing appliances in a power line network, comprising:
  obtaining an electrical characteristic of the power line network, using a sensor that is connected to the power line network;

extracting a line-neglecting feature from the electrical characteristic of the power line network; and
detecting an appliance connected to the power line network based on the extracted line-neglecting feature.

(2) The method of (1), wherein obtaining the electrical characteristic of the power line network comprises:
causing the sensor to inject a test signal $U_t$ (f, τ) and/or $I_t$ (f, τ) at a fixed frequency f and a varying line cycle position τ into the power line network, and to measure at least one of the group consisting of the voltage $U_o$(f, τ) and the current $I_o$(f, τ).

(3) The method of (2), wherein a plurality of test signals, each having a different fixed frequency, is caused to be injected at different timings.

(4) The method of (2), wherein a plurality of test signals, each having a different fixed frequency, is caused to be injected at one timing.

(5) The method of any of (2) to (4), wherein obtaining the electrical characteristic of the power line network comprises determining a real part and/or an imaginary part of an admittance Y(f, τ) being defined by:

$$Y(f, τ)=I_o(f, τ)/U_o(f, τ).$$

(6) The method of any of (1) to (5), wherein detecting the appliance connected to the power line network comprises comparing a line-neglecting feature of an electrical characteristic of the appliance and the line-neglecting feature of the electrical characteristic of the power line network.

(7) The method of any of (1) to (6),
wherein extracting the line-neglecting feature comprises identifying peaks or steps in the electrical characteristic of the power line network.

(8) The method of any of (1) to (7),
wherein extracting the line-neglecting feature comprises identifying a relative delay $Δτ=τ_- - τ_1$ between two peaks, two steps, a peak and a step or a step and a peak of the electrical characteristic of the power line network over a line cycle.

(9) The method of any of (1) to (8),
wherein extracting the line-neglecting feature comprises identifying an absolute time position τ of a peak or a step with respect to a line cycle phase of the electrical characteristic of the power line network.

(10) The method of any of (1) to (9), further comprising combining line-neglecting features associated with a set of candidate appliances so as to find a maximum number of matches with the line independent features of the power line network.

(11) The method of any (1) to (10), further comprising determining line-independent features for the appliance and storing the line-neglecting features in a storage.

(12) The method of any of (1) to (11), comprising detecting one or more appliances out of a plurality of candidate appliances based on line-neglecting features characterizing the plurality of candidate appliances.

(13) The method of any of (1) to (12), wherein detecting an appliance comprises a disaggregation method so as to detect a further appliance.

(14) The method of any of (1) to (13), further comprising identifying the detected appliance based on the line-neglecting feature.

(15) The method of (14), further comprising identifying an operation state of the identified appliance based on the line-neglecting feature.

(16) A sensor for analyzing appliances in a power line network, comprising:
a connector configured to be connected to the power line network;
a measurement unit configured to measure an electrical characteristic of the power line network;
a processor configured to extract a line-neglecting feature from the measured electrical characteristic of the power line network, and to detect a connected appliance based on the line-neglecting feature.

(17) The sensor according to (16), further comprising an appliance connector for connecting to an appliance, wherein the measurement unit is configured to measure an electrical characteristic of the appliance and the processor is configured to extract a line-neglecting feature from the measured electrical characteristic of the appliance.

(18) The sensor of (16) or (17), wherein the processor further is configured to detect one or more appliances out of a plurality of candidate appliances based on line-neglecting features characterizing the plurality of candidate appliances.

(19) The sensor of any of (16) to (18), wherein the processor further is configured to perform a disaggregation method so as to detect a further appliance.

(20) The sensor of any of (16) to (19), wherein the processor further is configured to identify the detected appliance based on the line-neglecting feature.

(21) The sensor of (20), wherein the processor further is configured to identify an operation state of the identified appliance.

(22) A system for analyzing appliances in a power line network, comprising
the sensor according to any of (16) to (21), and
a memory for storing line-neglecting features of a plurality of electrical devices.

(23) The system according to (22), further comprising a communication unit for transmitting a result of detecting a connected appliance.

(24) A computer program including computer-program instructions which when executed on a data processing apparatus cause the data processing apparatus to perform the method of any of (1) to (15).

(25) A non-transitory computer-readable medium including the computer program of (24).

(26) A device for analyzing an appliance, comprising:
an appliance connector configured to be connected to the appliance;
a measurement unit configured to measure an electrical characteristic of the appliance; and
a processor configured to extract a line-neglecting feature from the measured electrical characteristic of the appliance.

(27) The device according to (26), further comprising an additional connector to be connected to the power line network.

(28) The device according to (26) or (27), further comprising an interface to transmit the line-neglecting feature to an external device.

(29) The device according to (28), further comprising a memory for storing the line-neglecting feature.

(30) A method for analyzing an appliance, comprising:
obtaining an electrical characteristic of the appliance, using a sensor that is connected to the appliance; and
extracting a line-neglecting feature from the electrical characteristic of the appliance.

(31) The method of (30), wherein obtaining the electrical characteristic of the appliance comprises:
causing the sensor to inject a test signal $U_t$ (f, τ) and/or $I_t$ (f, τ) at a fixed frequency f and a varying line cycle position τ into the appliance, and to measure at least one of the group consisting of the voltage $U_o(f, \tau)$ and the current $I_o(f, \tau)$.

(32) The method of (31), wherein a plurality of test signals, each having a different fixed frequency, is caused to be injected at different timings.

(33) The method of (31) or (32), wherein obtaining the electrical characteristic of the appliance comprises determining a real part and/or an imaginary part of an admittance $Y(f, \tau)$ being defined by:

$$Y(f, \tau) = I_o(f, \tau)/U_o(f, \tau).$$

(34) The method of any of (31) to (33), wherein extracting the line-neglecting feature comprises identifying peaks or steps in the electrical characteristic of the power line network.

(35) The method of any of (31) to (34), wherein extracting the line-neglecting feature comprises identifying a relative delay $\Delta\tau = \tau_- - \tau_1$ between two peaks, two steps, a step and a peak or a peak and a step of the electrical characteristic of the power line network over a line cycle.

(36) The method of any of (31) to (35), wherein extracting the line-neglecting feature comprises identifying an absolute time position τ of a peak or a step with respect to a line cycle phase of the electrical characteristic of the power line network.

(37) A memory storing a plurality of line-neglecting features in association with an indication of an appliance that is characterized by the line-neglecting feature.

(38) The memory of (37), further storing an operation state of the appliance in association with the line-neglecting feature.

CROSS-REFERENCE TO RELATED APPLICATIONS

The present application claims priority of EP patent application No. 13 001 649.6 filed on 28 Mar. 2013, the entire contents of which are incorporated herein by reference.

The invention claimed is:

1. A method for analyzing appliances in a power line network, comprising:
   obtaining, with circuitry, an electrical characteristic of the power line network using a sensor that is connected to the power line network, wherein the electrical characteristic is based on an injected test signal having a fixed frequency and variable line cycle position;
   extracting, with the circuitry, a line-neglecting feature from the electrical characteristic of the power line network; and
   detecting, with the circuitry, an appliance connected to the power line network based on the extracted line-neglecting feature,
   wherein the line-neglecting feature corresponds to the appliance connected to the power line network, and the line-neglecting feature is independent of influence of the power line network.

2. The method of claim 1, wherein
   the sensor injects the test signal, which is $U_t(f, \tau)$ and/or $I_t(f, \tau)$, at the fixed frequency f and a varying line cycle position τ into the power line network, and measures at least one of the group consisting of the voltage $U_o(f, \tau)$ and the current $I_o(f, \tau)$.

3. The method of claim 2, wherein a plurality of test signals, each having a different fixed frequency, is caused to be injected at different timings.

4. The method of claim 2, wherein a plurality of test signals, each having a different fixed frequency, is caused to be injected at one timing.

5. The method of claim 2, wherein obtaining the electrical characteristic of the power line network comprises determining a real part and/or an imaginary part of an admittance $Y(f, \tau)$ being defined by:

$$Y(f, \tau) = I_o(f, \tau)/U_o(f, \tau).$$

6. The method of claim 1, wherein detecting the appliance connected to the power line network comprises comparing a line-neglecting feature of an electrical characteristic of the appliance and the line-neglecting feature of the electrical characteristic of the power line network.

7. The method of claim 1, wherein extracting the line-neglecting feature comprises identifying peaks or steps in the electrical characteristic of the power line network.

8. The method of claim 1, wherein extracting the line-neglecting feature comprises identifying a relative delay $\Delta\tau = \tau_- - \tau_1$ between two peaks, two steps, a peak and a step or a step and a peak of the electrical characteristic of the power line network over a line cycle.

9. The method of claim 1, wherein extracting the line-neglecting feature comprises identifying an absolute time position τ of a peak or a step with respect to a line cycle phase of the electrical characteristic of the power line network.

10. The method of claim 1, further comprising combining line-neglecting features associated with a set of candidate appliances so as to find a maximum number of matches with the line independent features of the power line network.

11. The method of claim 1, further comprising determining line-neglecting features for the appliance and storing the line-neglecting features in a storage.

12. The method of claim 1, comprising detecting one or more appliances out of a plurality of candidate appliances based on line-neglecting features characterizing the plurality of candidate appliances.

13. The method of claim 1, wherein detecting an appliance comprises a disaggregation method so as to detect a further appliance.

14. The method of claim 1, further comprising identifying the detected appliance based on the line-neglecting feature.

15. The method of claim 14, further comprising identifying an operation state of the identified appliance based on the line-neglecting feature.

16. A sensor for analyzing appliances in a power line network, comprising:
   a connector configured to be connected to the power line network; and
   circuitry connected to the connector and configured to
      measure an electrical characteristic of the power line network, wherein the electrical characteristic is based on an injected test signal having a fixed frequency and variable line cycle position,
      extract a line-neglecting feature from the measured electrical characteristic of the power line network, and
      detect a connected appliance based on the line-neglecting feature,
   wherein the line-neglecting feature corresponds to the connected appliance connected to the power line network, and the line-neglecting feature is independent of influence of the power line network.

17. The sensor according to claim 16, further comprising an appliance connector configured to connect to an appliance, wherein the circuitry is configured to measure an electrical characteristic of the appliance and extract a line-neglecting feature from the measured electrical characteristic of the appliance.

18. The sensor of claim 16, wherein the circuitry is further configured to detect one or more appliances out of a plurality of candidate appliances based on line-neglecting features characterizing the plurality of candidate appliances.

19. The sensor of claim 16, wherein the circuitry is further configured to perform a disaggregation method so as to detect a further appliance.

20. The sensor of claim 16, wherein the circuitry is further configured to identify the detected appliance based on the line-neglecting feature.

21. The sensor of claim 20, wherein the circuitry is further configured to identify an operation state of the identified appliance.

22. A system for analyzing appliances in a power line network, comprising:
the sensor according to claim 16, and
a memory configured to store line-neglecting features of a plurality of electrical devices.

23. The system according to claim 22, wherein the circuitry is further configured to transmit a result of detecting a connected appliance.

24. A device for analyzing an appliance, comprising:
an appliance connector configured to be connected to the appliance; and
circuitry configured to
connect to the appliance,
measure an electrical characteristic of the appliance,
wherein the electrical characteristic is based on an injected test signal having a fixed frequency and variable line cycle position, and
extract a line-neglecting feature from the measured electrical characteristic of the appliance, the line-neglecting feature being independent of influence of a power line network to which the appliance is connected.

25. The device according to claim 24, further comprising an additional connector to be connected to the power line network.

26. The device according to claim 24, wherein the circuitry includes an interface to transmit the line-neglecting feature to an external device.

27. The device according to claim 26, wherein the circuitry includes a memory configured to store the line-neglecting feature.

28. A method for analyzing an appliance, comprising:
obtaining, with circuitry, an electrical characteristic of the appliance using a sensor that is connected to the appliance, wherein the electrical characteristic is based on an injected test signal having a fixed frequency and variable line cycle position; and
extracting, with the circuitry, a line-neglecting feature from the electrical characteristic of the appliance, the line-neglecting feature being independent of influence of a power line network to which the appliance is connected.

29. A memory comprising:
circuitry configured to store a plurality of line-neglecting features in association with an indication of an appliance that is characterized by the line-neglecting feature, the line-neglecting features being independent of influence of a power line network to which the appliance, the line-neglecting features being extracted from an electrical characteristic of the appliance, wherein the electrical characteristic is based on an injected test signal having a fixed frequency and variable line cycle position.

30. The memory of claim 29, wherein the circuitry is further configured to store an operation state of the appliance in association with the line-neglecting feature.

* * * * *